(12) United States Patent
Erickson et al.

(10) Patent No.: US 6,958,541 B2
(45) Date of Patent: Oct. 25, 2005

(54) LOW GATE RESISTANCE LAYOUT PROCEDURE FOR RF TRANSISTOR DEVICES

(75) Inventors: Sean Erickson, Fort Collins, CO (US); Kevin Nunn, Fort Collins, CO (US); Norman Mause, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/627,289

(22) Filed: Jul. 25, 2003

(65) Prior Publication Data

US 2005/0017362 A1     Jan. 27, 2005

(51) Int. Cl.⁷ ............................................. H01L 23/48
(52) U.S. Cl. ...................... 257/758; 257/757; 257/377
(58) Field of Search ............................... 257/758, 759, 257/760, 755, 377, 192, 72, 330, 201, 757; 349/38

(56) References Cited

U.S. PATENT DOCUMENTS

| | | | |
|---|---|---|---|
| 5,705,301 A | 1/1998 | Garza et al. ................... 430/5 |
| 6,121,663 A * | 9/2000 | En et al. ...................... 257/377 |
| 6,269,472 B1 | 7/2001 | Garza et al. ................... 716/21 |
| 6,351,039 B1 * | 2/2002 | Jin et al. ...................... 257/759 |
| 6,544,829 B1 | 4/2003 | Gopinath et al. ........... 438/232 |

OTHER PUBLICATIONS

Weste, Neil et al.; Principles of CMOS VLSI Design; Addison-Wesley Pub. Co.; Oct., 1994; 113-116, 132-133.
Sze; VLSI Technology; McGraw-Hill; 1988; pp. 416-417.

* cited by examiner

*Primary Examiner*—Howard Weiss
*Assistant Examiner*—Vikki Hoa B. Trinh
(74) *Attorney, Agent, or Firm*—Suiter•West•Swantz PC LLO

(57) ABSTRACT

A region on a substrate contains multiple transistors in parallel that share a single salicided polysilicon gate electrode. Above or below the gate electrode are formed multiple plugs of refractory material along the length of the gate electrode. The multiple plugs of refractory material electrically interconnect the gate signal line and the salicided polysilicon gate electrode. The plug material is selected to minimize the work function between it and the salicided polysilicon gate electrode.

13 Claims, 5 Drawing Sheets

CONVENTIONAL

LOW GATE RESISTANCE LAYOUT PROCEDURE FOR RF TRANSISTOR DEVICES

FIELD OF THE INVENTION

The present invention generally relates to the field of integrated circuits, and particularly to a signal driver having a reduced number of transistors in which the gate resistance of one or more transistors is reduced.

BACKGROUND OF THE INVENTION.

Signal drivers are often formed of scores of transistors connected in parallel. These parallel transistors have their source contacts electrically interconnected and their drain contacts electrically interconnected. The parallel transistors share a gate electrode. At high operating frequencies, the resistance of the gate (Rg) of the transistors becomes problematic because the resistance is relatively large for the scale and establishes an RC (resistance-capacitance) time constant with nearby capacitances, including parasitic capacitances, forming timing delays for the signal. An exemplary current technique, as shown in FIG. 5, places many transistors in parallel and shortens the length of polysilicon from the contact to the end of the channel, lowering the total value of Rg. In FIG. 5, the gate signal input line 70 or branch thereof terminates with a relatively large poly contact pad 72 in proximity to the multiple transistors. The gate electrode common to the transistors has a relatively large pad 54 at one end that overlaps the gate signal line pad 72 and electrically connects to it through plugs 62.

Current techniques have four disadvantages. 1) Current techniques require routing the polysilicon gate electrode outside the active area introducing extra resistance which makes Rg larger. 2) Current techniques allow for a standard of two or more contacts attached to the large polysilicon pad which sets the contact resistance to a non-optimal value. 3) Signal timing and race conditions become critical when trying to activate hundreds of devices simultaneously. 4) At very high frequencies Rg is still too large even with hundreds of transistors in parallel.

Therefore, it would be desirable to provide a circuit arrangement that overcomes the problems of the prior art.

SUMMARY OF THE INVENTION

Accordingly, the present invention is directed to a transistor structure and method of making in which the transistor structure applies contacts along the length of a shared gate electrode.

In a first aspect of the present invention, a transistor structure includes a gate electrode formed of silicided polysilicon, a gate signal line, and a conductive plug formed of a column VIB metal of the periodic table and/or a refractory metal. The conductive plug electrically interconnects the gate electrode and the gate signal line. The gate electrode, the conductive plug, and the gate signal line are arranged vertically with respect to a substrate upon which the transistor structure is mounted.

The present invention increases the number of contacts and removes extraneous polysilicon routing. This reduces the gate resistance appreciably. Any increase in capacitance is offset by the (1/ω) inverse dependence of frequency upon capacitance. A major difference in the present invention is that the contacts on the polysilicon gate are distributed across the length of the transistors instead of tapping into the gate at the side of the multiple transistor region of a signal driver.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The present invention relates to a structure and method for reducing the resistance of a salicided polysilicon gate electrode by adding auxiliary metallization contacts to the gate electrode. The resulting structure provides radio frequency operation between 1 and 10 GHz with a preferred operational frequency of about 1.8 GHz. The resulting structure obviates the need for an expanded polysilicon area at the junction of a gate signal input line and the gate electrode. The auxiliary metallization contacts extend over a portion or the full length of the gate electrode. The auxiliary contacts are preferably formed of metal from column VIB of the Periodic Table and/or a refractory metal. (A refractory metal is niobium (Nb), tantalum (Ta), molybdenum (Mo), tungsten (W), or rhenium (Re).) Thus, molybdenum and tungsten are both column VIB metals and refractory metals.) The substrate is preferably a semiconductor substrate, but may be an insulating substrate upon which a semiconductive layer is formed.

Figure 1:
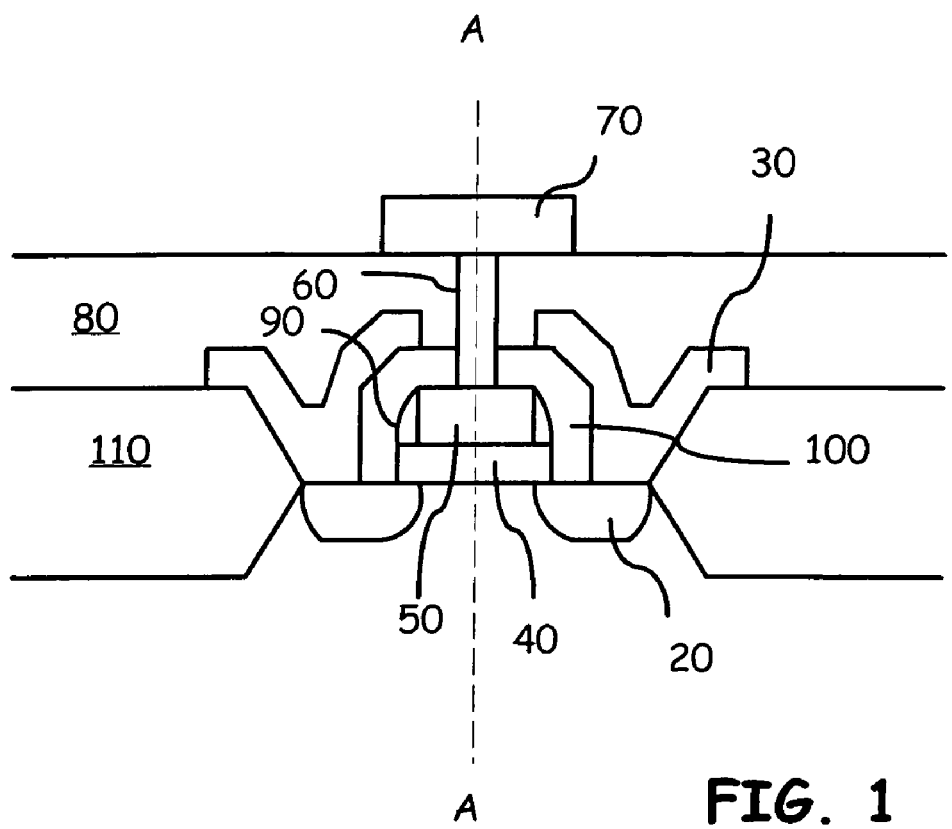
FIG. 1 illustrates a cross sectional view of a first and preferred embodiment of a transistor structure of the present invention.

FIG. 1 shows a cross sectional view of the preferred embodiment of the transistor-plug-signal line structure of the present invention. This transistor structure is well suited for applications in which multiple transistors are placed in parallel and in which the multiple parallel transistors supply signals to a common output pad. In a semiconductor (e.g., silicon crystals) substrate, source and drain diffusion regions 20 are formed. The silicon crystal substrate is planar from the source to the drain contacts. A field oxide layer 110 is created. A gate dielectric layer 40 is formed between the source and drain diffusion regions 20 and preferably has a thickness of 6.8 nm. The polysilicon gate electrode 50 is 6.8 nanometers above the silicon crystal substrate. Spacers 90 are formed to the sides of the polysilicon gate electrode 50. The basic transistor structure is enclosed by a dielectric layer 100. The source and drain contacts 30 are a minimum spacing of 145 nm away from the polysilicon gate electrode 50 and within 200 nm of the polysilicon gate electrode, edge-to-edge. Preferably, the spacing between the gate edge and the source or drain contact edge is 180 nm. Through the dielectric layer 80 is formed one or more vias through which a conductive plug 60 is formed. The conductive plug may be formed from a periodic table column IVB, VB, VIB, and/or VIIB metal, including alloys. The conductive plug 60 preferably is formed of a column VIB metal such as chromium, molybdenum, and tungsten (and/or a refractory metal outside of column VIB). More preferably, tungsten is used because of its compatibility with other materials; especially, with copper that may be used for the gate signal line. The polysilicon gate electrode 50 is self aligned silicided (i.e., salicided) to match the work function of the conductive plug 60. Matching the work functions helps to reduce the parasitic Schottky diode, electrically equivalent to a capacitor, that always forms when two dissimilar conductors meet. The salicidization process preferably involves a cobalt dopant implant. Cobalt salicidization increases the work function of the gate electrode material and forms an etch-stop barrier so that when the holes are formed in the oxide for contacts, the cobalt is not etched away. Instead of or in combination with cobalt, titanium may be used in the salicidization process. The gate signal line 70 may be formed of copper, aluminum, or other suitable conductive material. The conductive plug electrically connects the gate signal line 70 to the gate electrode 50 and serves to prevent contamination between the gate electrode 50 and the gate signal line 70. The channel regions between adjacent transistors may be electrically isolated while the source regions of the transistors are portions of one unbroken diffusion region and the drain regions are portions of another unbroken diffusion region. The drain and source contacts 30 preferably are formed of tungsten which is in electrical contact with a layer of silicon which has been silicided or salicided. In an alternative embodiment, the structure of FIG. 1 may be constructed in reverse such that the gate signal line 70 is formed first on the substrate and the source and drain regions and the field oxide layer 110 are formed later.

Figure 2:
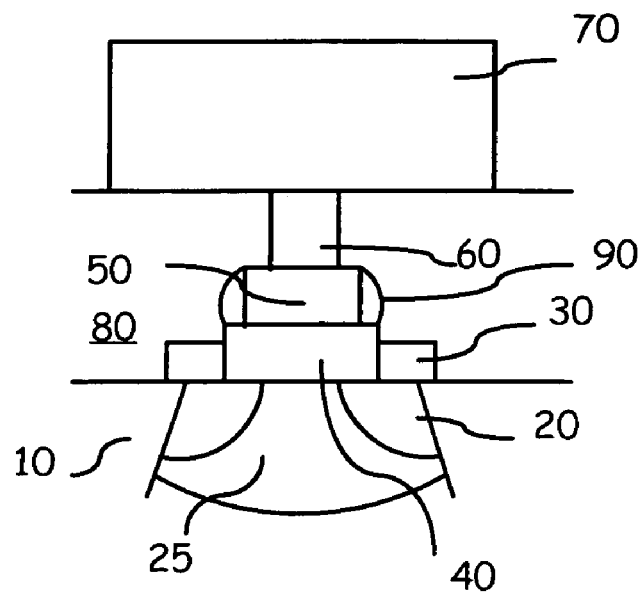
FIG. 2 illustrates a cross sectional view of a second and alternative embodiment of the transistor structure of the present invention.

FIG. 2 shows a cross sectional view of a second embodiment of the transistor-plug-signal line structure of the present invention. FIG. 2 is directed to those applications which require the transistors individually to do separate tasks. Within a semiconductor layer or substrate, a region 25 is doped with either N or P type dopants. Preferably, the substrate is a P type or N type substrate. Then, within the region 25 or P or N type substrate, smaller regions (i.e., diffusion regions) 20 are formed by doping more strongly with the other of N or P type dopants. For example, for an N type metal oxide semiconductor, the region 25 is doped with P dopants and the smaller regions (i.e., diffusion regions) are doped more strongly with N type dopants. For a P type metal oxide semiconductor, the reverse holds in that the larger region 25 is N doped and the smaller regions (i.e., diffusion regions) 20 are P doped. Isolation trenches 10 are formed in the semiconductor layer or substrate. Source and drain terminals 30 are formed over the regions 20. A gate dielectric layer 40 is formed between the source and drain terminals 30. A self aligned silicided (i.e., salicided) polysilicon gate electrode 50 is formed on the gate dielectric layer 40.

Figure 3:
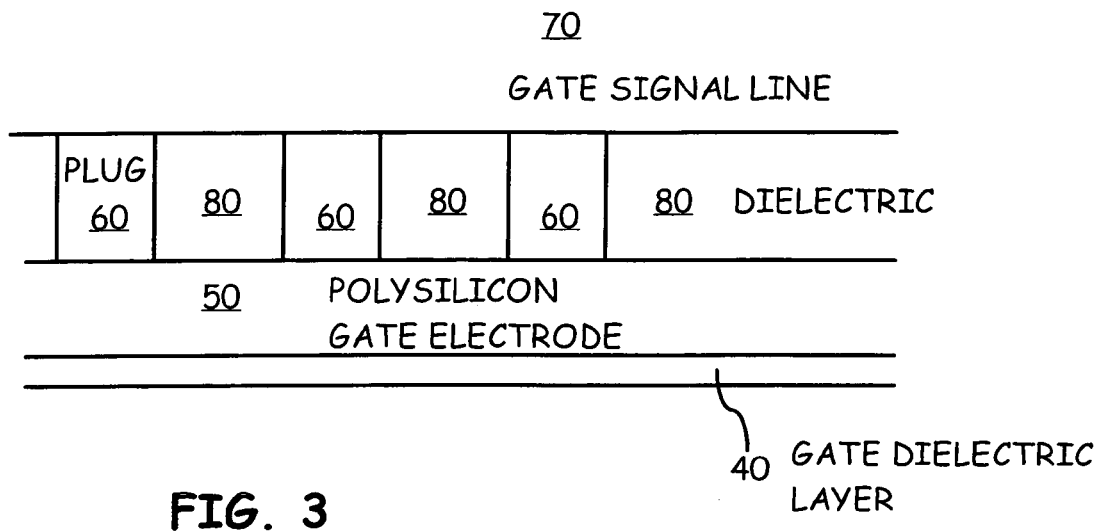
FIG. 3 illustrates a longitudinal cross section view of the transistor structure with other transistor structures according to the cut line A—A of FIG. 1.

FIG. 3 illustrates a view of the transistor along cut line A—A in FIG. 1. FIG. 3 shows multiple plugs 60 along the length of the gate electrode 50. Each plug 60 may correspond to one transistor or every second or third transistor. Alternatively, two plugs 60 may be formed for a transistor. The plugs 60 may be 200 nm to 500 nm high as measured from the gate electrode 50 to the gate signal line 70. More preferably, the plugs 60 may be 250 nm to 300 nm in height. In the present example, the plugs 60 are 280 nm high. Preferably, a single plug is provided to a single transistor on a one to one basis. Multiple plugs may be provided to a single transistor. In other embodiments, in which multiple transistors share the same gate electrode, the transistors along a portion of the length of the gate electrode may have plugs and the transistors along another portion of the gate electrode may not have plugs. For instance, the first 70% of the transistors along the gate electrode may have plugs, while the remaining 30% do not. Usually, though, all the transistors will each have a plug.

Figure 4:
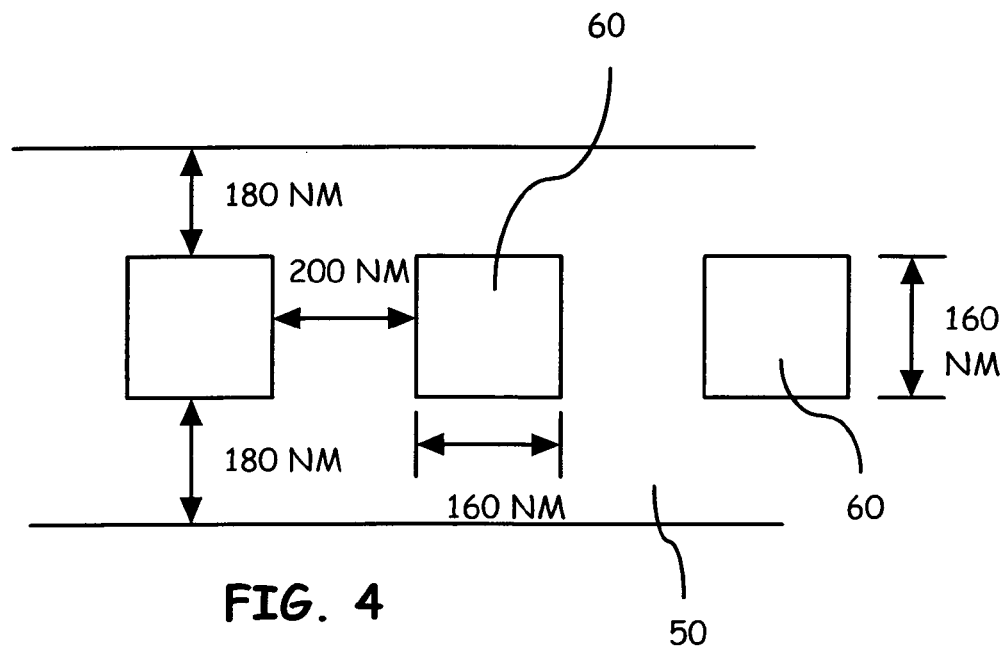
FIG. 4 illustrates a top down view of the transistor structure gate electrode of FIG. 1.

FIG. 4 illustrates a top down view of the plugs in relation to the gate electrode. Although shown with a squarish cross section in FIG. 4, the conductive plug 60 cross section may be circular, oval, rectangular, or polygonal. The conductive plug 60 cross section may be shamrock or fluted shaped to reduce resistance. The cross sectional shape should be of a form that avoids current crowding or dead zones to current flow. In general, for a shaped cross sectional plug 60, the sides (or dimensions) may vary between 120 nm and 400 nm. Preferably, the sides are between 140 nm and 200 nm. In the example of FIG. 4, the sides of the plug are 160 nm×160 nm. The gate electrode 50 generally may have a length between 2 microns and 10 microns, a width of 300 nm to 1 micron, and a thickness of 120 nm to 300 nm. Preferably, the gate electrode 50 has a length between 4 microns and 6 microns, a width between 300 nm and 550 nm, and a thickness of between 150 nm and 200 nm. In the example of FIG. 4, the gate electrode has a length of 4.8 microns, a width of 420 nm, and a height of 180 nm. The plug may be multilayer. In one embodiment, a 1 nm thickness of refractory material in the plug is in contact with the polysilicon gate electrode while the remainder of the plug is formed of another metal (such as copper, aluminum, nickel, silver, or gold) or metal alloy.

Figure 5:
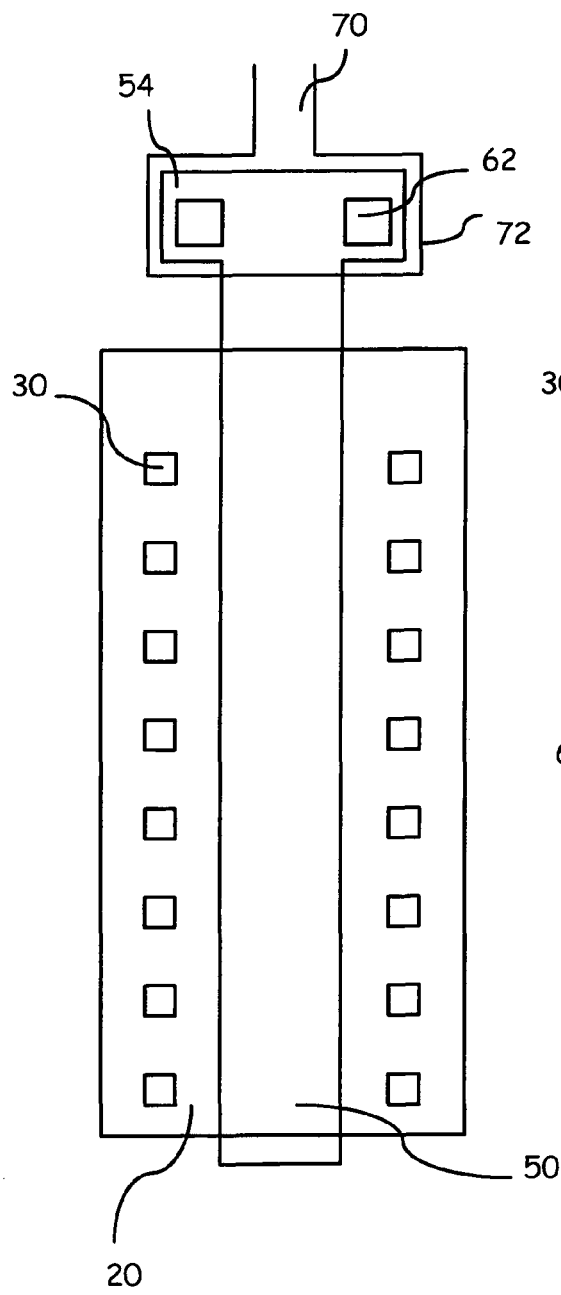
FIG. 5 illustrates an embodiment of multiple parallel transistors which share a salicided polysilicon gate electrode according to a current technique.
Figure 6:
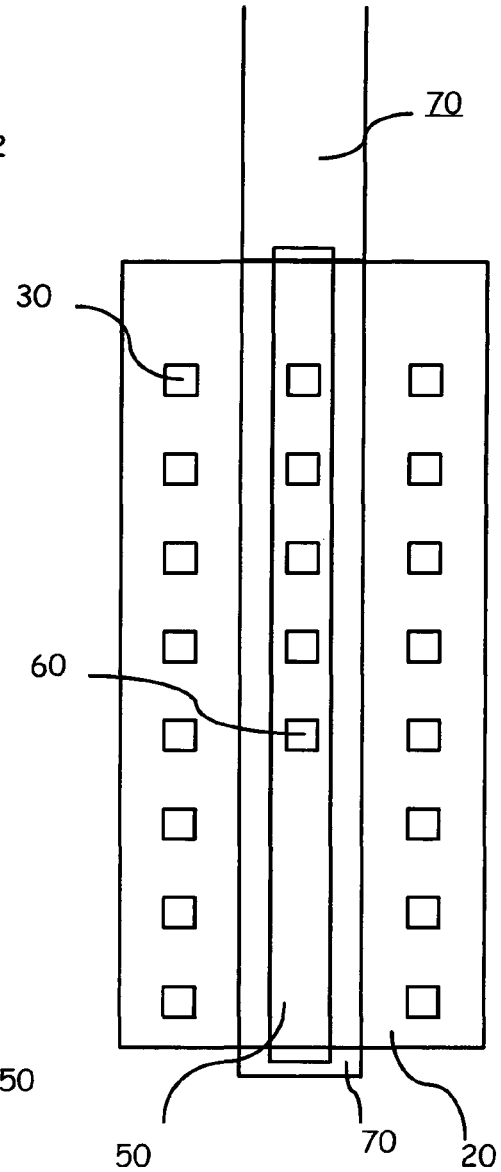
FIG. 6 illustrates an embodiment of multiple parallel transistors which share a salicided polysilicon gate electrode according to the present invention.
Figure 7:
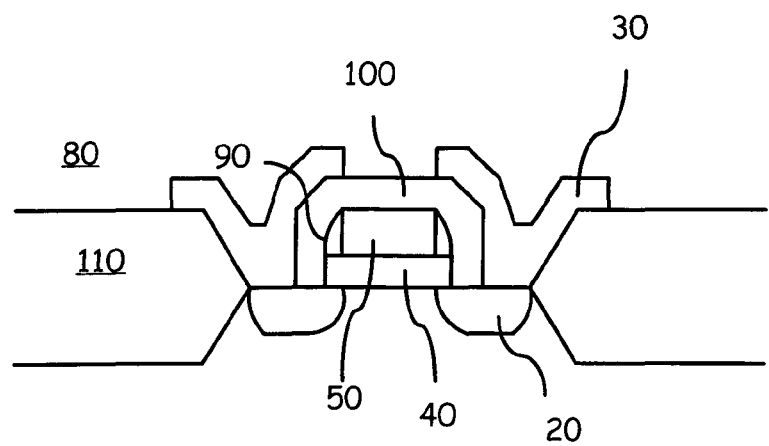
FIGS. 7–10 illustrate method steps for forming the transistor structure of the present invention.

FIG. 6 shows an embodiment of a layout of multiple transistors, as for a signal driver, according to the present invention. In contrast to a current technique (as shown in FIG. 5), the present invention does not use large contact pads for either the gate signal line or the polysilicon gate electrode 50. Whereas the current technique layout of FIG. 5 has a gate resistance of approximately 69 ohms±32 ohms, the gate resistance of the layout in FIG. 6 is approximately 2.2±2 ohms. Each contact's resistance is about 10 ohms with a very high process skew rate. Although salicided polysilicon has a unit resistance of approximately 8 ohms/square, the present invention reduces the contact resistance contribution significantly by placing the contact on or in very close proximity to the transistor and by using multiple contacts distributed along the length of the gate electrode. (The estimated gate resistance values for FIG. 6 is based on a layout with 180 nm×180 nm×280 nm square plugs of tungsten that electrically connected with the salicided polysilicon gate electrode.) The gate signal line 70 or branch from the gate signal line extends across the channel regions of the multiple transistors. Each transistor may be formed from a source or drain terminal 30 and a portion of the gate electrode 50. In an alternative embodiment, isolation trenches may be used to electrically isolate the transistors from each other. Other features that may be used to form the transistors are field oxide layers, implant windows, and protective spacers around the gate.

FIGS. 7–10 illustrate an embodiment of a method for forming the conductive plugs 60 on the basic transistor structure. The gate electrode 50 may be simply silicided or may be self aligned silicided (i.e., salicided). Generally, the substrate is covered with a very thick field oxide (FOX). Windows are cut into this FOX to allow transistor implantation. A very thin oxide layer is grown. The very thin oxide layer may be formed using materials such as black diamond or silk, proprietary names for high K dielectric materials. Instead of an oxide, a nitride may be used. After the thin oxide is formed, amorphous silicon is deposited, patterned, and etched away. The amorphous silicon is annealed to form polycrystalline silicon. The thin oxide layer that is not covered by polysilicon is etched away also. Source and drain regions are implanted by forming holes or windows in an overlying dielectric layer. The source and drain regions are lightly implanted with boron for an N type transistor or phosphorus for a P type transistor. Other dopant materials may be used. Spacers, such as nitride spacers, are added. The polysilicon is preferably then doped to enhance conductivity and then salicided using cobalt which also enhances conductivity, forming a protective barrier for the contact process and increasing the work function of the polysilicon gate to approximate the work function of the tungsten contacts. In an alternative embodiment, a transistor structure may be formed by the method outlined in U.S. Pat. No. 6,544,829, herein incorporated by reference in its entirety, or by other known techniques. Additionally or alternatively, spacers, vias, and other structures may be formed by Optical Proximity Correction techniques, as, for example, described in U.S. Pat. Nos. 6,269,472, and 5,705,301, herein incorporated by reference in its entirety.

Figure 8:
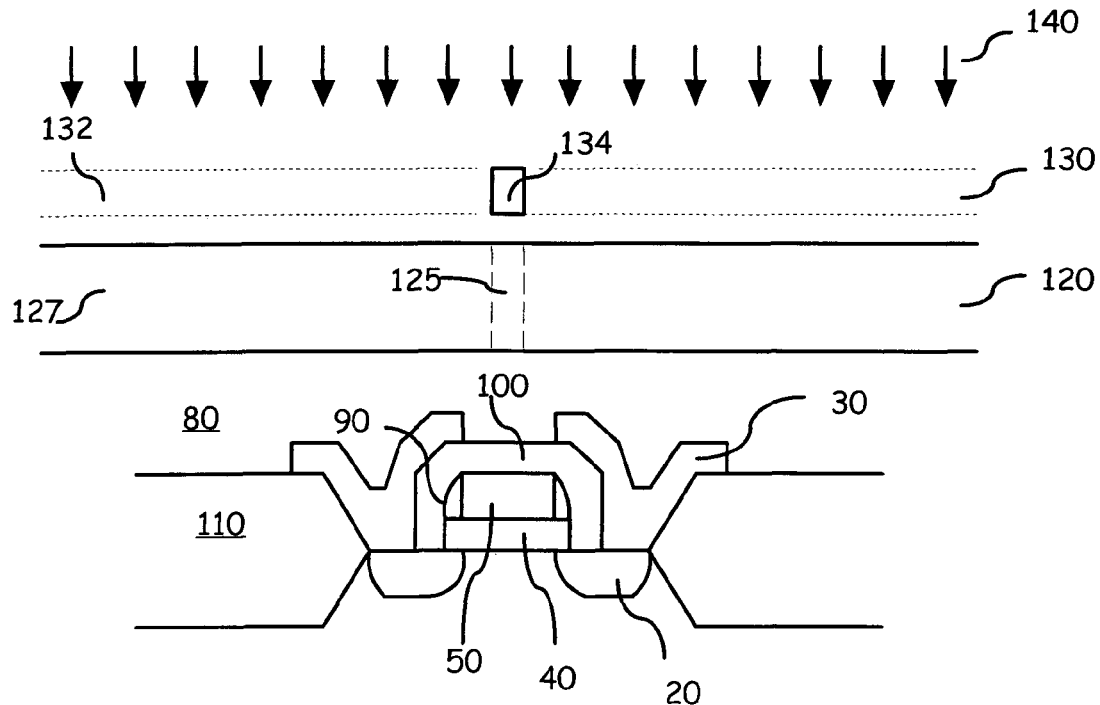
Figure 9:
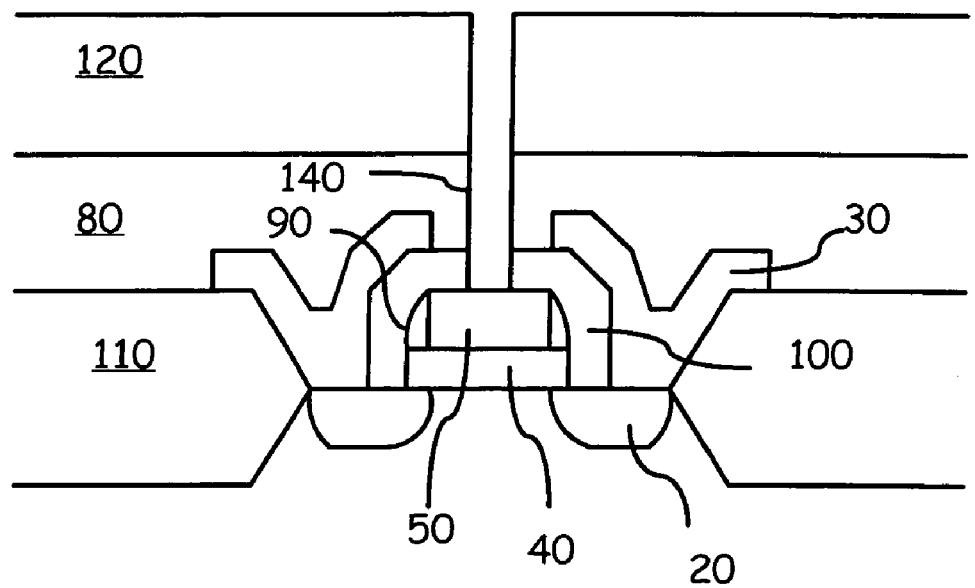
Figure 10:
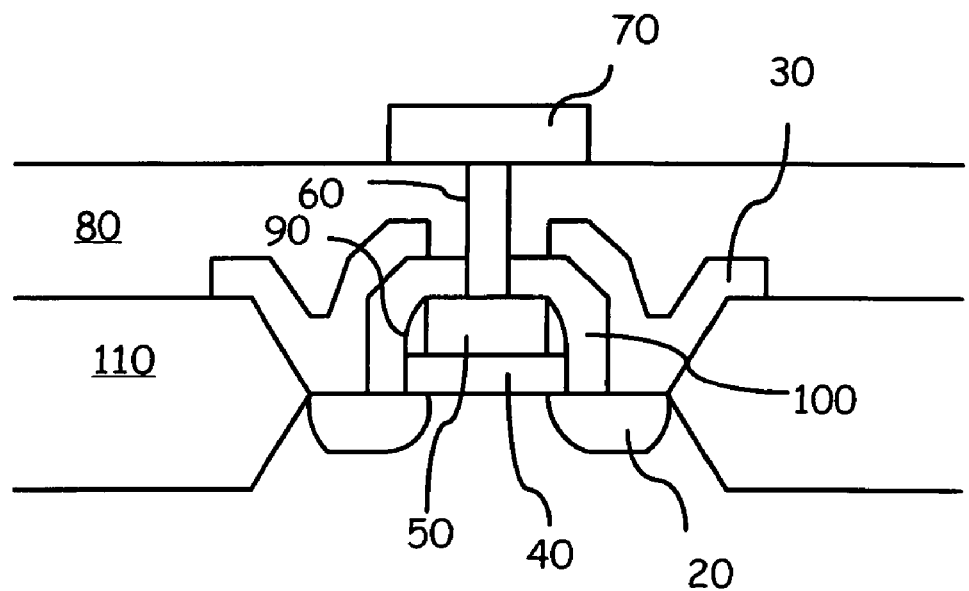

FIGS. 8–10 illustrate an embodiment of the method particular to the present invention. FIG. 8 A coating of field oxide or other dielectric 80 is applied over the transistors. Either a negative or positive photoresist layer 120 is laid over the dielectric 80. A negative photoresist is shown in FIG. 8. The ultraviolet (UV) light 140 passes through a mask 130. The mask has UV light blocking portions 134 and UV light transmissive portions 132. The UV light that passes through the mask 130 polymerizes the areas 127 of the photoresist layer 120 left exposed by the mask 130. A solvent may then be applied which removes the unexposed areas 125. FIG. 9 illustrates that the formation of the vias 140. A metal layer, such as tungsten, is laid over the dielectric layer 80. Further etching is used to remove the metal layer and the photoresist layer 120. A polishing step (e.g., chemical mechanical polishing) is performed to level the tops of the metal plugs 60. Then, another resist layer is deposited or a field oxide layer is formed, patterned, and etched and a gate signal line material is coated onto openings in the resist over the dielectric 80 and conductive plugs 60. The gate signal line material is then patterned to form the gate signal lines.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages, the form hereinbefore described being merely an explanatory embodiment thereof. It is the intention of the following claims to encompass and include such changes.

What is claimed is:

1. A transistor structure, comprising:
a single gate electrode formed of silicided polysilicon,
a gate signal line, and
a plurality of conductive plugs formed of a periodic table column IVB, VB, VIB, and/or VIIB metal, each of the plurality of conductive plugs electrically interconnecting the single gate electrode in a distributed manner across a length of the single gate electrode and the gate signal line,
wherein the single gate electrode, the conductive plug, and the gate signal line are arranged vertically with respect to a substrate upon which the transistor structure is mounted.

2. The transistor structure of claim 1, wherein the conductive plug is formed of two or more layers.

3. The transistor structure of claim 2, wherein each of the two or more layers is formed of a different material.

4. The transistor structure of claim 1, wherein the conductive plug has a rectangular cross section.

5. The transistor structure of claim 4, wherein the conductive plug has a width between 120 nm and 400 nm, inclusive, a length between 120 nm and 400 nm, inclusive, and a height between 200 nm to 500 nm.

6. The transistor structure of claim 5, wherein the conductive plug has a width of 160 nm, a length of 160 nm, and a height of 280 nm.

7. The transistor structure of claim 1, where in the gate electrode has a generally rectangular shape.

8. The transistor structure of claim 7, wherein the gate electrode has a length between 2 microns and 10 microns, a width between 300 nm and 1 micron, and a thickness between 120 nm and 300 nm.

9. The transistor structure of claim 8, wherein the gate electrode has a length of 4.8 microns, a width of 420 nm, and a height of 180 nm.

10. The transistor structure of claim 1, wherein the conductive plug is formed of chromium or molybdenum.

11. The transistor structure of claim 1, wherein the conductive plug is formed of tungsten.

12. The transistor structure of claim 1, wherein the gate signal line is formed of copper.

13. The transistor structure of claim 1, wherein the gate signal line is formed of aluminum.

* * * * *